(12) United States Patent
Iwai

(10) Patent No.: US 8,134,884 B2
(45) Date of Patent: Mar. 13, 2012

(54) SEMICONDUCTOR MEMORY DEVICE

(75) Inventor: Hitoshi Iwai, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 420 days.

(21) Appl. No.: 12/470,928

(22) Filed: May 22, 2009

(65) Prior Publication Data
US 2009/0300261 A1 Dec. 3, 2009

(30) Foreign Application Priority Data

May 28, 2008 (JP) ................................. 2008-139001

(51) Int. Cl.
G11C 8/00 (2006.01)
G06F 12/06 (2006.01)
G06F 13/00 (2006.01)
G06F 9/34 (2006.01)

(52) U.S. Cl. ......... 365/230.03; 365/230.05; 365/230.06; 711/5; 711/131; 711/149; 711/202

(58) Field of Classification Search .............. 711/5, 131, 711/149, 202; 365/230.03, 230.05, 230.06
See application file for complete search history.

(56) References Cited

U.S. PATENT DOCUMENTS

| | | | | |
|---|---|---|---|---|
| 5,875,470 A | * | 2/1999 | Dreibelbis et al. ................. | 711/5 |
| 7,159,067 B2 | * | 1/2007 | Kanno et al. ....................... | 711/5 |
| 7,616,518 B2 | * | 11/2009 | Im et al. .................... | 365/230.05 |
| 7,694,077 B2 | * | 4/2010 | Hironaka et al. ......... | 365/230.05 |
| 7,715,269 B2 | * | 5/2010 | Kajigaya .................. | 365/230.05 |
| 7,752,398 B2 | * | 7/2010 | Caulk ............................... | 711/5 |
| 7,773,439 B2 | * | 8/2010 | Do et al. ................... | 365/230.05 |
| 7,783,827 B2 | * | 8/2010 | Katsuki et al. ..................... | 711/5 |
| 7,870,326 B2 | * | 1/2011 | Shin et al. ......................... | 711/5 |
| 7,870,351 B2 | * | 1/2011 | Resnick ............................. | 711/5 |
| 7,873,776 B2 | * | 1/2011 | Hetherington et al. ........... | 711/5 |
| 7,941,612 B2 | * | 5/2011 | Shin et al. ................ | 365/230.05 |
| 7,965,530 B2 | * | 6/2011 | Han et al. ................. | 365/230.05 |

FOREIGN PATENT DOCUMENTS

| | | |
|---|---|---|
| JP | 5-109279 | 4/1993 |
| JP | 2000-339999 | 12/2000 |
| JP | 2002-270000 | 9/2002 |

* cited by examiner

*Primary Examiner* — Trong Phan

(74) *Attorney, Agent, or Firm* — Oblon, Spivak, McClelland, Maier & Neustadt, L.L.P.

(57) ABSTRACT

A semiconductor memory device comprises a memory unit having a first and a second port and including plural banks; a bank address conversion circuit operative to convert a first bank address fed from external into a second bank address different from the first bank address and operative to supply the first bank address to one of the first and second ports and supply the second bank address to the other of the first and second ports; and a write data conversion circuit operative to convert input data fed from external into write data different from the input data and operative to supply the input data to one of the first and second ports and supply the converted write data to the other of the first and second ports.

20 Claims, 12 Drawing Sheets

FIG. 5

|  | Port 0 | | | | Port 1 | | |
|---|---|---|---|---|---|---|---|
|  | RBS<2><br>CBS<2> | RBS<1><br>CBS<1> | RBS<0><br>CBS<0> |  | AISEL<2><br>AISEL<2> | AISEL<1><br>AISEL<1> | AISEL<0><br>AISEL<0> |
|  | 0 | 1 | 0 |  | 0 | 0 | 1 |
|  | RBS<2> | RBS<1> | RBS<0> |  | RBS<2> | RBS<1> | RBS<0> |
|  | CBS<2> | CBS<1> | CBS<0> |  | CBS<2> | CBS<1> | CBS<0> |
|  | 0 | 1 | 0 |  | 0 | 1 | 1 |

| | |
|---|---|
| Bank #0 | 000 |
| Bank #1 | 001 |
| Bank #2 | 010 |
| Bank #3 | 011 |
| Bank #4 | 100 |
| Bank #5 | 101 |
| Bank #6 | 110 |
| Bank #7 | 111 |

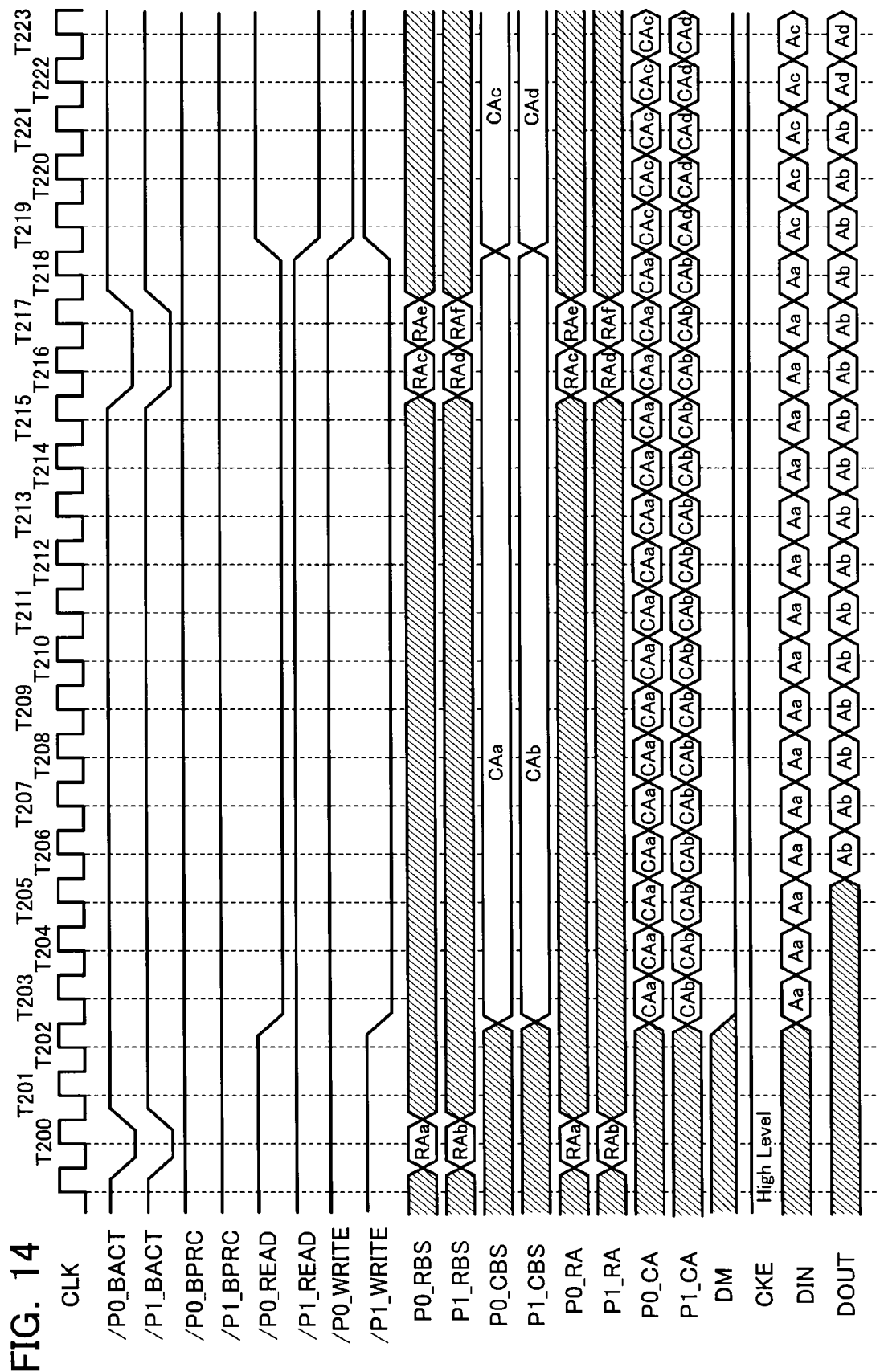

SEMICONDUCTOR MEMORY DEVICE

CROSS-REFERENCE TO RELATED APPLICATION

This application is based upon and claims the benefit of priority from the prior Japanese Patent Application No. 2008-139001, filed on May 28, 2008, the entire contents of which are incorporated herein by reference.

BACKGROUND OF THE INVENTION

1. Field of the Invention

The present invention relates to a semiconductor memory device, and more particularly to a test function in a multi-bank 2-port memory device.

2. Description of the Related Art

In image processing, for example, a memory requires unbroken, continuous read/write operations and concurrent processing such as bank activation and precharge.

A general 1-port multi-bank memory has one port, which comprises control lines for feeding bank active, bank precharge, read, write, row address and column address signals, and data lines for feeding read data and write data. This configuration allows only one command to enter in an identical cycle. Accordingly, it is not possible to execute read and write operations at the same time.

On the other hand, a 2-port multi-bank memory has two ports each provided with respective bank active, bank precharge, read, write, row address and column address control lines. Therefore, it is possible to feed plural commands in an identical cycle and execute read and write operations at the same time.

As obvious from the above, because the 2-port multi-bank memory can support image processing and so forth by one piece, it is more advantageous in cost and so forth than the 1-port multi-bank memory (Patent Document 1: JP 5-109279A).

The existing test systems (hereinafter referred to as "general memory testers") owned by the semiconductor memory manufacturers have been produced for the purpose of testing 1-port memories in many cases and are difficult to test 2-port multi-bank memories sufficiently based on the actual specs for the following reasons.

Firstly, the general memory tester can not generate plural different addresses at the same time even when it is required to feed different addresses to 2 ports individually in a test on concurrent read/write operations and so forth.

Secondly, it is only possible to generate identical write data and expected-value data (read data) at the same time.

SUMMARY OF THE INVENTION

In an aspect the present invention provides a semiconductor memory device, comprising: a memory unit having a first and a second port and including plural banks; a bank address conversion circuit operative to convert a first bank address fed from external into a second bank address different from the first bank address and operative to supply the first bank address to one of the first and second ports and supply the second bank address to the other of the first and second ports; and a write data conversion circuit operative to convert input data fed from external into write data different from the input data and operative to supply the input data to one of the first and second ports and supply the converted write data to the other of the first and second ports.

In another aspect the present invention provides a semiconductor memory device, comprising: a memory unit having a first and a second port and including plural banks; and a bank address conversion circuit operative to convert a first bank address fed from external into a second bank address different from the first bank address and operative to supply the first bank address to one of the first and second ports and supply the second bank address to the other of the first and second ports.

In another aspect the present invention provides a semiconductor memory device, comprising: a memory unit having a first and a second port and including plural banks; a bank address register operative to store a bank address fed from external; a bank address conversion circuit operative to convert the bank address fed from external or the bank address stored in the bank address register into a bank address different from these bank addresses and operative to supply the bank address before conversion to one of the first and second ports and supply the bank address after conversion to the other of the first and second ports; and a write data conversion circuit operative to convert input data fed from external into write data different from the input data and operative to supply the input data to one of the first and second ports and supply the converted write data to the other of the first and second ports.

BRIEF DESCRIPTION OF THE DRAWINGS

FIG. 5 shows a correspondence table of bank addresses at a port 0 and a port 1 in accordance with the row bank address conversion circuit and the column bank address conversion circuit in the same semiconductor memory device.

FIG. 14 is a timing chart of concurrent read/write/bank active operations in a semiconductor memory device according to a third embodiment of the present invention.

DETAILED DESCRIPTION OF THE EMBODIMENTS

The embodiments associated with the semiconductor memory device according to the present invention will now be described in detail with reference to the drawings.

First Embodiment

Figure 1:
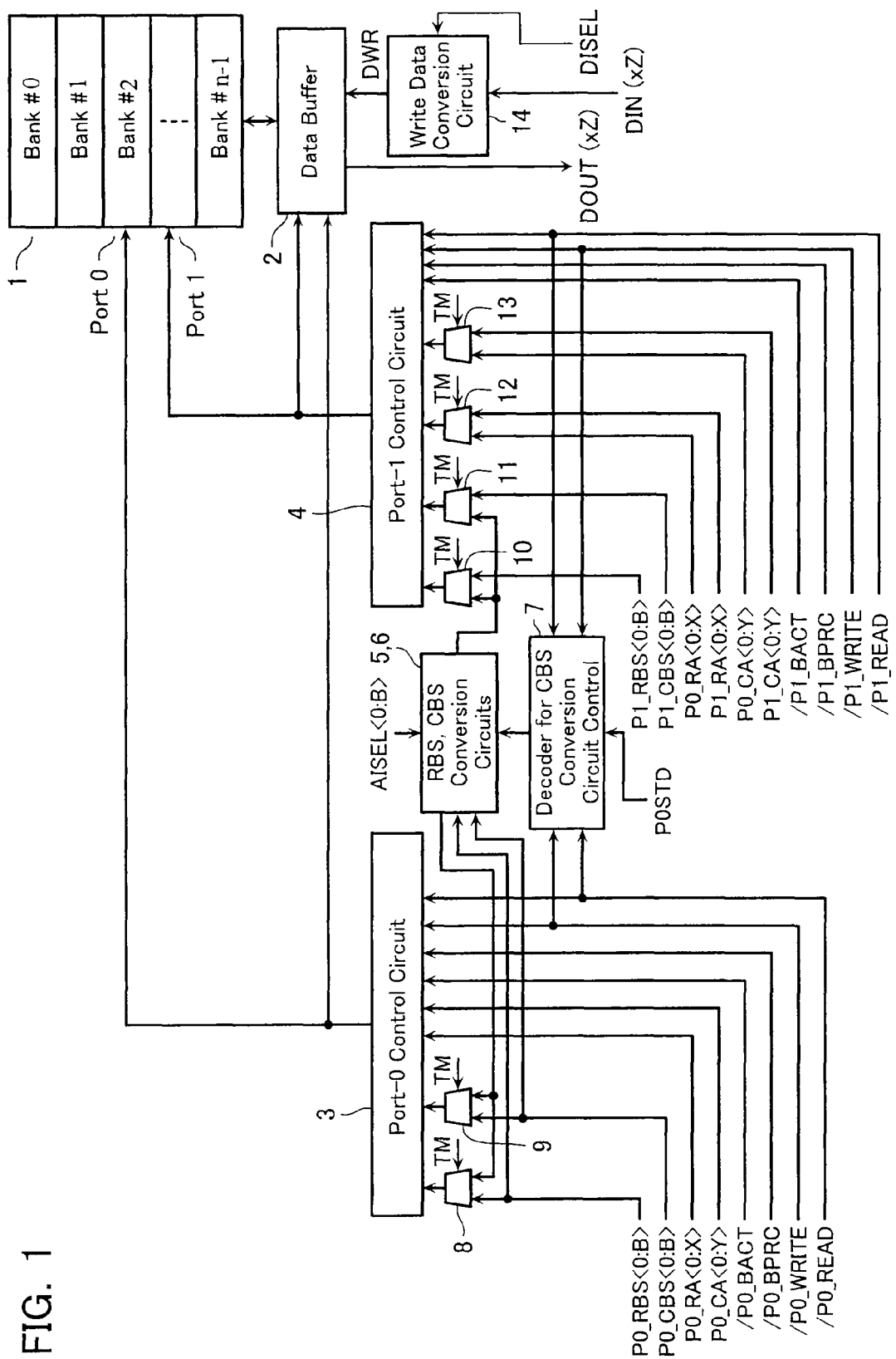
FIG. 1 is a block diagram of a semiconductor memory device according to a first embodiment of the present invention.

FIG. 1 is a block diagram of a semiconductor memory device according to a first embodiment of the present invention.

The semiconductor memory device according to the present embodiment comprises a memory unit 1, which has a first and a second port, that is, a port 0 and a port 1, and is divided into plural banks, bank #0, bank #1, bank #2, ..., bank #n; a data buffer 2 operative to control data input/output between the memory unit 1 and the outside via DOUT (xZ); and a port-0 control circuit 3 and a port-1 control circuit 4, which control the port 0 and the port 1. It also comprises RBS, CBS bank address conversion circuits 5, 6 with input AISEL<0:B> operative to receive a first bank address given from external and generate a second bank address different therefrom and operative to supply the second bank address to either the port-0 control circuit 3 with P0_RBS<0:B>, P0_CBS<0:B>, P0_RA<0:X>, P0_CA<0:Y>, /P0_BACT, /P0_BPRC, /P0_WRITE, /P0_READ, or the port-1 control circuit 4 with P1_RBS<0:B>, P1_CBS<0:B>, P0_RA<0:X>, P1_RA<0:X>, P0_CA<0:Y>, P1_CA<0:Y>, /P1_BACT, /P1_BPRC, /P1_WRITE, /P1_READ; and a decoder 7 for CBS Conversion Circuit Control for column bank address conversion circuit control operative to control the bank address conversion circuits 5, 6. It further comprises a write data conversion circuit 14 operative to convert input data fed from external DIN (xZ) and DISEL and supply the converted input data to the data buffer 2 via DWR.

Each of the banks in the memory unit 1 includes plural word lines, and plural bit lines crossing these word lines. There are memory cells connected at the intersections of the word lines and the bit lines.

The data buffer 2 receives write data DWR given from the write data conversion circuit 14 and supplies it to the memory unit 1. It also receives data output from the memory unit 1 and provides it as output data DOUT to external. These operations are controlled by the port-0 control circuit 3 or the port-1 control circuit 4.

The port-0 control circuit 3 is supplied, in general, with a row address P0_RA used to select a word line; a column address P0_CA used to select a bit line; a first row bank address P0_RBS output in sync with the row address P0_RA to select P0_RA activate a bank; a first column bank address P0_CBS output in sync with the column address P0_CA to select a bank and execute a read operation or a write operation; a bank active signal /P0_BACT used to activate a bank (herein and hereinafter the mark "/" means an "L"-active negative logic signal); a bank precharge signal /P0_BPRC used to terminate the operation to the current bank and prepare an operation to another bank; and a write signal /P0_WRITE and a read signal /P0_READ. It controls the port 0 based on these signals. On the other hand, at the time of testing, the port-0 control circuit is supplied with a row bank address P0_RBS' and a column bank address P0_CBS' given from the bank address conversion circuits 5, 6 via selection switches 8 and 9 in place of the row bank address P0_RES and the column bank address P0_CBS. The selection switches 8 and 9 are controlled with a test mode signal TM given from external at the time of testing.

The port-1 control circuit 4 is supplied, similar to the port-0 control circuit 3, in general, with a row address P1_RA, a column address P1_CA, a row bank address P1_RBS, a column bank address P1_CBS, a bank active signal /P1_BACT, a bank precharge signal /P1_EPRC, and a write signal /P1_WRITE and a read signal /P1_READ. It controls the port 1 based on these signals. On the other hand, the port-0 control circuit is supplied with a row bank address P1_RBS' and a column bank address P1_CBS' given from the bank address conversion circuits 5, 6 via selection switches 10 and 11 at the time of testing in place of the row bank address P1_RBS and the column bank address P1_CBS. It is also supplied with a row address P0_RA and a column address P0_CA given via selection switches 12 and 13 in place of the row address P1_RA and the column address P1_CBS. The selection switches 10-13 are controlled with the test mode signal TM given from external at the time of testing.

The bank address conversion circuits 5, 6 include a row bank address conversion circuit 5 and a column address conversion circuit 6.

The row bank address conversion circuit 5 receives the first row bank address P0_RBS given from external and generates a second row bank address P0_RBS2 different from the first row bank address P0_RBS. The row bank address conversion circuit 5 supplies the first row bank address P0_RBS as the row bank address P0_RBS' or P1_RBS' via the selection switch 8 or 10 to one of the port-0 control circuit 3 and the port-1 control circuit 4 and supplies the second row bank address P0_RBS2 to the other.

Figure 2:
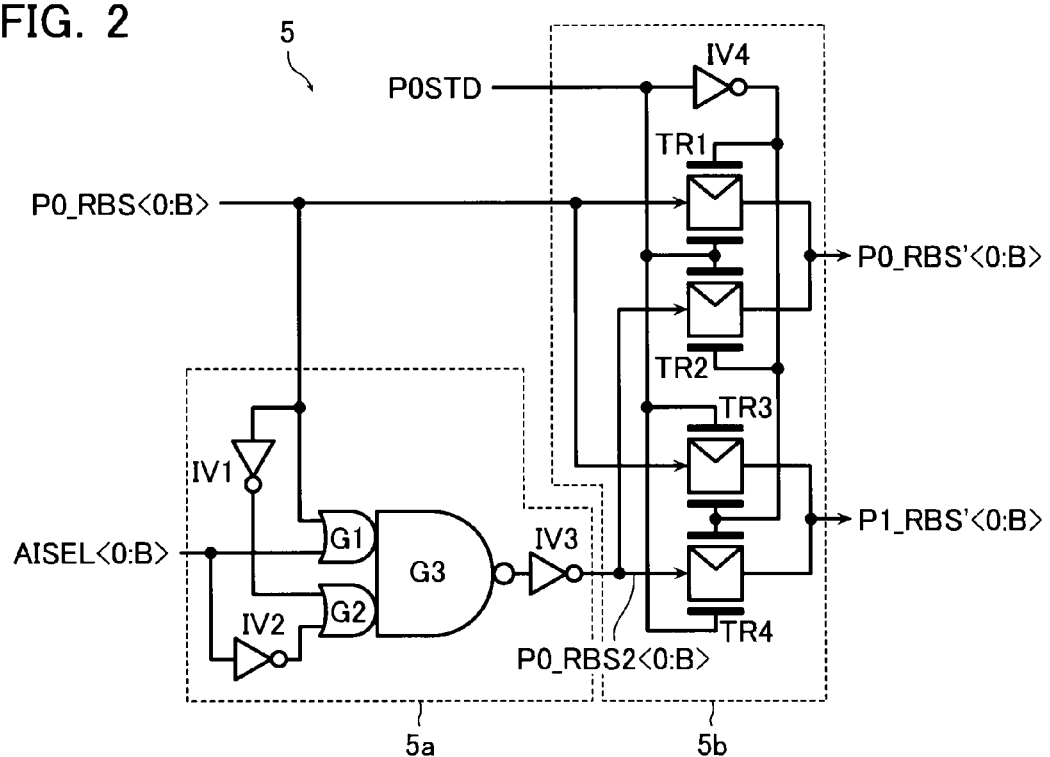
FIG. 2 is a circuit diagram of a row bank address conversion circuit in the same semiconductor memory device.

FIG. 2 is a circuit diagram of the row bank address conversion circuit 5. The circuit shown in the figure only shows a circuit for one bit in a row bank address and, in practice, such circuits are provided by the number corresponding to the bits in the row bank address.

The row bank address conversion circuit 5 includes a row bank address conversion unit 5a, which receives the first row bank address P0_RBS<0:B> and an inversion bit selection signal AISEL<0:B> and provides the second row bank address P0_RBS2<0:B>, and a selection gate unit 5b, which receives the first row bank address P0_RBS<0:B> and the second row bank address P0_RBS2<0:B> and selectively distributes these bank addresses P0_RBS<0:B>, P0_RBS2<0:B> to the selection switches 8 and 10 based on a port-0 standard signal P0STD. The port-0 standard signal P0STD is a signal that defines the port 0 as the standard when it is "H" and the port 1 as the standard when it is "L".

The row bank address conversion unit 5a includes an OR gate G1, which receives the first row bank address P0_RBS<0:B> and the inversion bit selection signal AISEL<0:B>, and an OR gate G2, which receives the inverted signal of the first row bank address P0_RBS<0:B> output from an inverter IV1 and the inverted signal of the inversion bit selection signal AISEL output from an inverter IV2. The outputs from these OR gates G1 and G2 are fed to a NAND gate G3, from which output is inverted through an inverter IV3 and provided as the second row bank address P0_RBS2. The inversion bit selection signal AISEL has a value of (B+1) bits including "1" indicative of inversion-intended bits and "0" for others, of (B+1) bits given in the row bank address P0_RBS<0:B>.

The selection gate unit 5b includes four transfer gates TR1-TR4. The transfer gates TR1 and TR2 select one of the first row bank address P0_RBS<0:B> and the second row bank address P0_RBS2<0:B> fed to respective sources and supply the selected one to the selection switch 8 as the row bank address P0_RBS'<0:B>. The transfer gates TR3 and TR4 select one of the first row bank address P0_RBS<0:B> and the second row bank address P0_RBS2<0:B> fed to respective sources and supply the selected one to the selection switch 10 as the row bank address P1_RBS'<0:B>. The transfer gates TR1 and TR4 include NMOS transistors and PMOS transistors, of which gates are supplied with the port-0 standard signal P0STD and the inverted signal thereof, respectively. The transfer gates TR2 and TR3 include PMOS transistors and NMOS transistors, of which gates are supplied with the port-0 standard signal P0STD and the inverted signal thereof, respectively. When the port-0 standard signal P0STD="L", this configuration turns the row bank address P0_RBS'<0:B> at the port 0 and the row bank address P1_RBS' at the port 1 to the second rowbank address P0_RBS2<0:B> and the first row bank address P0_RBS<0:B>, respectively. In contrast, when the port-0 standard signal P0STD="H", it turns the row bank address P0_RES' at the port 0 and the row bank address P1_RBS'<0:B> at the port 1 to the first row bank address P0_RBS<0:B> and the second row bank address P0_RBS2<0:B>, respectively.

Operation of this circuit is described next.

It is assumed herein that the row bank address P0_RBS<0:B> has a value of 3 bits "010" and the inversion bit selection signal AISEL<0:E> has a value of 3 bits "001".

In this case, as for the bit 0, because of P0_RBS<0>=0 and AISEL<0>=1, the outputs from the OR gates G1, G2 become "1", "1", respectively. Therefore, the NAND gate G3 and the inverter IV3 turn the output from the row bank address conversion unit 5a to "1". As for the bit 1 and the bit 2, similarly, the outputs from the row bank address conversion unit 5a become "1", "0". Therefore, the output from the row bank address conversion unit 5a exhibits "011", which is equal to the row bank address P0_RBS<0:2> except that the 0-th bit is inverted. The output from the row bank address conversion unit 5a becomes the second row bank address P0_RBS2<0:2>.

In the case of the port-0 standard signal P0STD="H", the transfer gates TR1 and TR4 are turned on and the transfer gates TR2 and TR3 are turned off. Therefore, the row bank address P0_RBS'<0:B> becomes "010" that is equal to the first row bank address P0_RBS<0:B>, and the row bank address P1_RBS'<0:B> becomes "011" that is equal to the second row bank address P0_RBS2<0:B>. In contrast, in the case of the port-0 standard signal P0STD="L", the transfer gates TR1 and TR4 are turned off and the transfer gates TR2 and TR3 are turned on. Therefore, the row bank address P0_RBS' becomes "011" that is equal to the second row bank address P0_RBS2<0:B>, and the row bank address P1_RBS'<0:B> becomes "010" that is equal to the first row bank address P0_RBS<0:B>.

The column bank address conversion circuit 6 receives the first column bank address P0_CBS<0:B> given from external and generates a second column bank address P0_CBS2<0:B> different from the first column bank address P0_CBS<0:B>. Further, the column bank address conversion circuit 6 supplies the column bank address P0_CBS<0: B> as the column bank address P0_CBS'<0:B> or P1_CBS'<0:B> via the selection switch 9 or 11 to one of the port-0 control circuit 3 and the port-1 control circuit 4 and supplies the second column bank address P0_CBS2<0:B> to the other.

Figure 3:
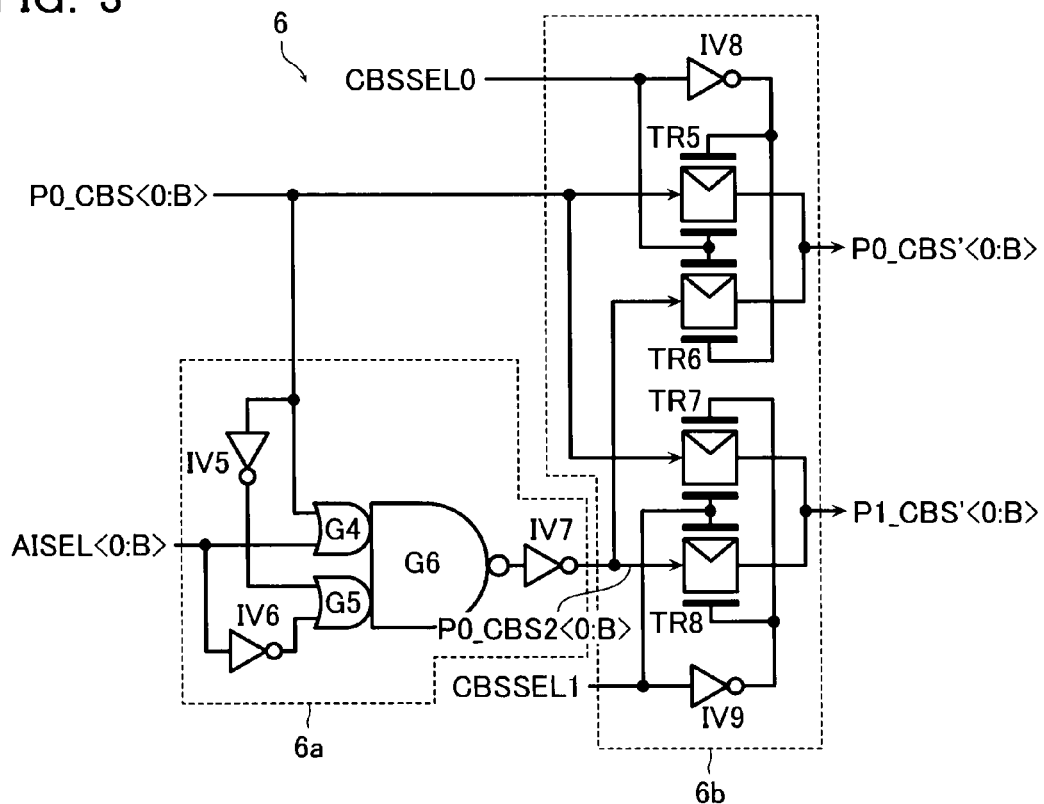
FIG. 3 is a circuit diagram of a column bank address conversion circuit in the same semiconductor memory device.

FIG. 3 is a circuit diagram of the column bank address conversion circuit 6. The circuit shown in the figure only shows a circuit for one bit in a column bank address and, in practice, such circuits are provided by the number corresponding to the bits in the column bank address.

The column bank address conversion circuit 6 includes a column bank address conversion unit 6a, which receives the first column bank address P0_CBS<0:B> and an inversion bit selection signal AISEL<0:B> and provides the second column bank address P0_CBS2<0:B>, and a selection gate unit 6b, which receives the first column bank address P0_CBS<0:B> and the second column bank address P0_CBS2<0:B> and selectively distributes these column bank addresses P0_CBS<0:B>, P0_CBS2<0:B> to the selection switches 9 and 11 based on a port-0 column bank address selection signal CBSSEL0 and a port-1 column bank address selection signal CBSSEL1 given from the decoder 7 for column bank address conversion circuit control.

The column bank address conversion unit 6a includes an OR gate G4, which receives the first column bank address P0_CBS<0:B> and the inversion bit selection signal AISEL<0:B>, and an OR gate G5, which receives the inverted signal of the column bank address P0_CBS<0:B> output from an inverter IV5 and the inverted signal of the inversion bit selection signal AISEL output from an inverter IV6. The outputs from these OR gates G4 and G5 are fed to a NAND gate G6, from which output is inverted through an inverter IV7 and provided as the second column bank address P0_CBS2<0:B>. The inversion bit selection signal AISEL has a value of (B+1) bits including "1" indicative of inversion-intended bits and "0" for others, of (B+1) bits given in the column bank address POCBS<0:B>.

The selection gate unit 6b includes four transfer gates TR5-TR8. The transfer gates TR5 and TR6 select one of the first column bank address P0_CBS<0:B> and the second column bank address P0_CBS2<0:B> fed to respective sources and supply the selected one to the selection switch 9 as the column bank address P0_CBS'<0:B>. The transfer gates TR3 and TR4 select one of the first column bank address P0_CBS<0:B> and the second column bank address P0_CBS2<0:B> fed to respective sources and supply the selected one to the selection switch 11 as the column bank address P1_CBS'<0:B>. The transfer gate TR5 includes an NMOS transistor and a PMOS transistor, of which gates are supplied with the port-0 column bank address selection signal CBSSEL0 and the inverted signal thereof, respectively. On the other hand, the transfer gate TR6 includes a PMOS transistor and an NMOS transistor, of which gates are supplied with the port-0 column bank address selection signal CBSSEL0 and the inverted signal thereof, respectively. In addition, the transfer gate TR7 includes an NMOS transistor and a PMOS transistor, of which gates are supplied with the port-1 column bank address selection signal CBSSEL1 and the inverted signal of IV9, respectively. On the other hand, the transfer gate TR8 includes an NMOS transistor and a PMOS transistor, of which gates are supplied with the port-1 column bank address selection signal CBSSEL1 and the inverted signal of IV9, respectively. When the port-0 column bank address selection signal CBSSEL0="L" and the port-1 column bank address selection signal CBSSEL1="H", this configuration turns the column bank addresses P0_CBS'<0:B> and P1_CBS'<0:B> to the second column bank address P0_CBS2<0:B> and the first column bank address P0_CBS<0:B>, respectively. In contrast, when the port-0 column bank address selection signal CBSSEL0="H" and the port-1 column bank address selection signal CBSSEL1="L", it turns the column bank addresses P0_CBS'<0:B> and P1_CBS'<0:B> to the column bank address P0_CBS<0:B> and the second column bank address P0_CBS2<0:B>, respectively.

Operation of this circuit is described next.

It is assumed herein that the column bank address P0_CBS<0:B> has a value of 3 bits "010" and the inversion bit selection signal AISEL<0:B> has a value of 3 bits "001".

In this case, as for the bit 0, because of P0_CBS<0>=0 and AISEL<0>=0, the outputs from the OR gates G4, G5 become "1", "1", respectively. Therefore, the NAND gate G6 and the inverter IV7 turn the output from the column bank address conversion unit 6a to "1". As for the bit 1 and the bit 2, similarly, the outputs from the column bank address conversion unit 6a become "1", "0". Therefore, the output from the column bank address conversion unit 6a exhibits "001", which is equal to the column bank address P0_CBS<0:2> except that the 0-th bit is inverted. The output from the column bank address conversion unit 6a becomes the second column bank address P0_CBS2<0:B>.

In the case of the port-0 column bank address selection signal CBSSEL0="H" and the port-1 column bank address selection signal CBSSEL1="L", the transfer gates TR5 and TR6 are turned on and the transfer gates TR6 and TR7 are turned off. Therefore, the column bank address P0_CBS'<0: B> becomes "010" that is equal to the first column bank address P0_CBS<0:B>, and the column bank address P1_CBS'<0:B> becomes "011" that is equal to the second column bank address P0_CBS2<0:B>. In contrast, in the case of the port-0 column bank address selection signal CBSSEL0="L" and the port-1 column bank address selection signal CBSSEL1="H", the transfer gates TR5 and TR8 are turned off and the transfer gates TR6 and TR7 are turned on. Therefore, the column bank address P0_CBS'<0:B> becomes "011" that is equal to the second column bank address P0_CBS2<0:B>, and the column bank address P1_CBS'<0: B> becomes "010" that is equal to the first column bank address P0_RBS<0:B>.

The decoder 7 for column bank address conversion circuit control is a circuit for determining a port for read operation-use as the standard, that is, a port supplied with the first column bank address P0_CBS<0: B> given from external. It receives write signals /P0_WRITE, /P1_WRITE and read signals /P0_READ, /P1_READ and controls the column bank address conversion circuit 6 based on these signals.

Figure 4:
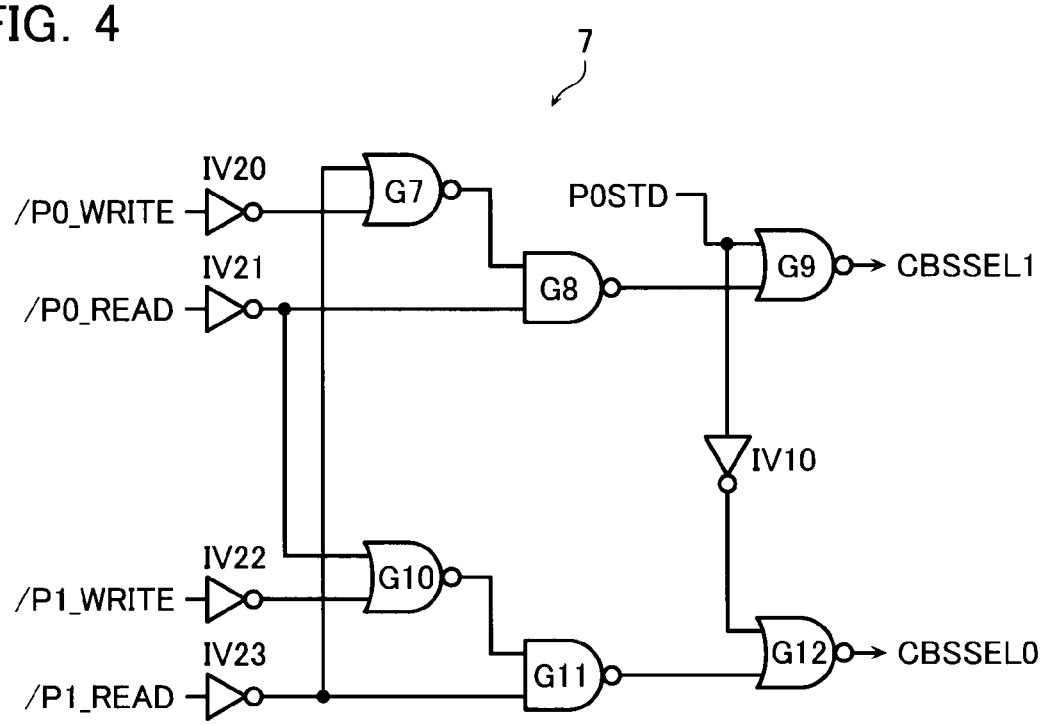
FIG. 4 is a circuit diagram of a decoder for column bank address conversion circuit control in the same semiconductor memory device.

FIG. 4 is a circuit diagram of the decoder 7 for column bank address conversion circuit control.

The decoder 7 for column bank address conversion circuit control includes a NOR gate G7 operative to receive the read signal /P1_READ via IV23 and the write signal /P0_WRITE via IV20; a NAND gate G8 operative to receive the output from the NOR gate G7 and the read signal /P0_READ via IV21; and a NOR gate G9 operative to receive the port-0 standard signal P0STD and the output from the NAND gate G8. The output from the NOR gate G9 is transferred as the port-1 column bank address selection signal CBSSEL1 to the column bank address conversion circuit 6. It also includes a NOR gate G10 operative to receive the read signal /P0_READ and the write signal /P1_WRITE via IV22; a NAND gate G11 operative to receive the output from the NOR gate G10 and the read signal /P1_READ; and a NOR gate G12 operative to receive the output from the NAND gate G11 and the inverted signal of the port-0 standard signal P0STD output from an inverter IV10. The output from the NOR gate G12 is transferred as the port-0 column bank address selection signal CBSSEL0 to the column bank address conversion circuit 6.

Operation of this circuit is described next.

The following description is given to the case where the port 0 is determined as the standard and the port 0 is used in read operation and the port 1 in write operation.

In this case, the input signals are set as follows: the port-0 standard signal P0STD="H", the write signal /P0_WRITE="H" at the port 0, the read signal /P0_READ="L" at the port 0, the write signal /P1_WRITE="L" at the port 1, and the read signal /P1_READ="H" at the port 1. Therefore, the output from the NOR gate G7 is "L" and the output from the NAND gate G8 is "H". As a result, the output from the NOR gate G9, that is, the port-1 column bank address selection signal CBSSEL1 becomes "L". On the other hand, the output from the NOR gate G10 is "H" and the output from the NAND gate G11 is "L". As a result, the output from the NOR gate G12, that is, the port-0 column bank address selection signal CBSSEL0 becomes "H". Finally, the column bank address P0_CBS' at the port 0 becomes the first column bank address P0_CBS, and the column bank address P1_CBS' at the port 1 becomes the second column bank address P0_CBS2.

The following description is given to the case where the port 1 is determined as the standard and the port 0 is used in write operation and the port 1 in read operation.

In this case, the input signals are set as follows: the port-0 standard signal P0STD="L", the write signal /P0_WRITE="L" at the port 0, the read signal /P0_READ="H" at the port 0, the write signal /P1_WRITE="H" at the port 1, and the read signal /P1_READ="L" at the port 1. Therefore, the output from the NOR gate G7 is "H" and the output from the NAND gate G8 is "L". As a result, the output from the NOR gate G9, that is, the port-1 column bank address selection signal CBSSEL1 becomes "H". On the other hand, the output from the NOR gate G10 is "L" and the output from the NAND gate G11 is "H". As a result, the output from the NOR gate G12, that is, the port-0 column bank address selection signal CBSSEL0 becomes "L". Finally, the column bank address P0_CBS' at the port 0 becomes the second column bank address P0_CBS2, and the column bank address P1_CBS' at the port 1 becomes the first column bank address P0_CBS.

As can be found from the above, the column bank address conversion circuit 6 is controlled such that the first column bank address P0_CBS fed from external is supplied to the column bank address P0_CBS' or P1_CBS' of the port for read operation-use of two ports, and the second column bank address P0_CBS2 is supplied to the port for write operation-use for the following reason. If the column bank address P0_CBS' or P1_CBS' for read operation-use is set at the second column bank address P0_CBS2, the comparison value given from the memory tester is compared with the data read with the second column bank address P0_CBS2, and thus the memory tester can not carry out a correct test.

FIG. 5 shows an example of the correspondence table of bank addresses at the port 0 and the port 1 in accordance with the row bank address (RBS) conversion circuit 5 and the column bank address (CBS) conversion circuit 6. Exemplary banks included are bank #0, bank #1, bank #2, bank #3, bank #4, bank #5, bank #6, and bank #7.

When the inversion bit selection signal AISEL<2:0> is "001" shown in the right hand three columns as AISEL<2>, AISEL<1>, and AISEL<0>, and "010" is given as the row bank address RA_RBS from external, the row bank address conversion circuit 5 and the column bank address conversion circuit 6 generate "011" as the second bank address with the first bit inverted, which is transferred to the port-1 control circuit 4. The states of RBS and CBS for port 0 and port 1 are shown for the respective bits RBS<2> RBS<1> RBS<0> CBS<2> CBS<1> and CBS<0>. The bit readings for each of the banks are shown to the left as 000, 001, 010, 011, 100, 101, 110, 111. The solid dots show the position on the table for the respective banks of the bit combination shown in row 7 of the table as read from the top. As a result, adjacent banks #2 and #3 are activated to permit concurrent read/write operations to these banks. Setting the inversion bit selection signal AISEL in this way makes it possible to carry out a test on malfunctions due to the interference between adjacent banks and so forth. Further, the inversion bit selection signal AISEL can be set arbitrarily and therefore operation tests with combinations of all banks can be made flexibly.

The write data conversion circuit 14 in the present embodiment is operative to invert bits in the input data DIN given from external and supply the inverted data to the data buffer 2.

Figure 6:
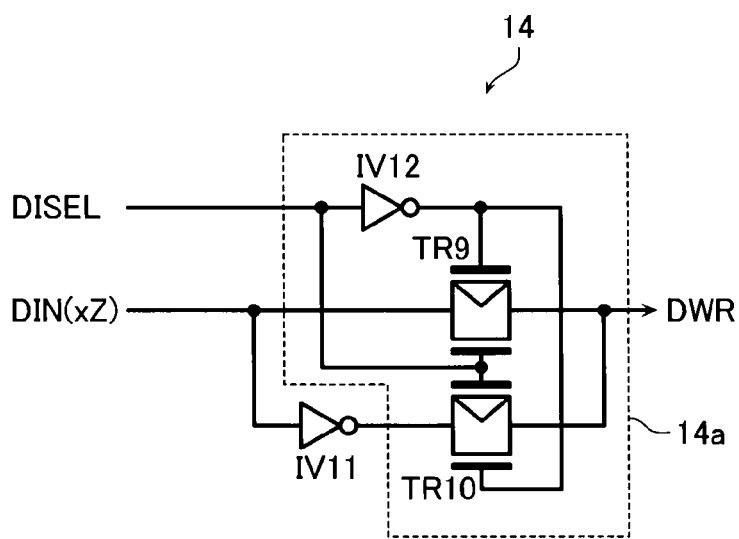
FIG. 6 is a circuit diagram of a write data conversion circuit in the same semiconductor memory device.

FIG. 6 is a circuit diagram of the write data conversion circuit 14.

The write data conversion circuit 14 comprises an inverter IV11 operative to receive the input data DIN (xZ), and a data selection unit 14a operative to selectively provide the input data DIN (xZ) and the output from the inverter IV11 as the write data DWR to the data buffer 2.

The data selection unit 14a includes a transfer gate TR9 operative to receive the input data DIN (xZ) at the source and provide the input data from the drain to the data buffer 2, and a transfer gate TR10 operative to receive the inverted data of the input data DIN (xZ) output from the inverter IV11 at the source and provide the inverted input data from the drain to the data buffer 2. An NMOS transistor in the transfer gate TR9 and a PMOS transistor in the transfer gate TR10 have respective gates, which are supplied with a data inversion selection signal DISEL. On the other hand, a PMOS transistor in the transfer gate TR9 and an NMOS transistor in the transfer gate TR10 have respective gates, which are supplied with the inverted signal of the data inversion selection signal DISEL output from an inverter IV12.

Operation of this circuit is described next.

When the data inversion selection signal DISEL="L", the transfer gates TR9 and TR10 are turned on and off, respectively. Therefore, the input data DIN (xZ) is provided to the data buffer 2 as it is. In contrast, when the data inversion selection signal DISEL="H", the transfer gates TR9 and TR10 are turned off and on, respectively. Therefore, the inverted data of the input data DIN (xZ) output from the inverter IV16 is provided to the data buffer 2.

The write data conversion circuit 14 makes it possible to generate output data DOUT different from the input data DIN (xZ). Namely, a general memory tester is restricted such that it can supply only one data at a time and accordingly can not make the input data DIN (xZ) different the output data DOUT (expected-value data). The inversion of the input data DIN (xZ), however, makes it possible.

In particular, the bit inversion of the input data DIN (xZ) can make the input data DIN (xZ) opposite in level polarity to the output data DOUT, thereby carrying out a test on the interference such as data leakage between both lines for transferring the input data DIN (xZ) and the output data DOUT.

Subsequently, a test on concurrent read/write operations according to the present embodiment is described.

Figure 7:
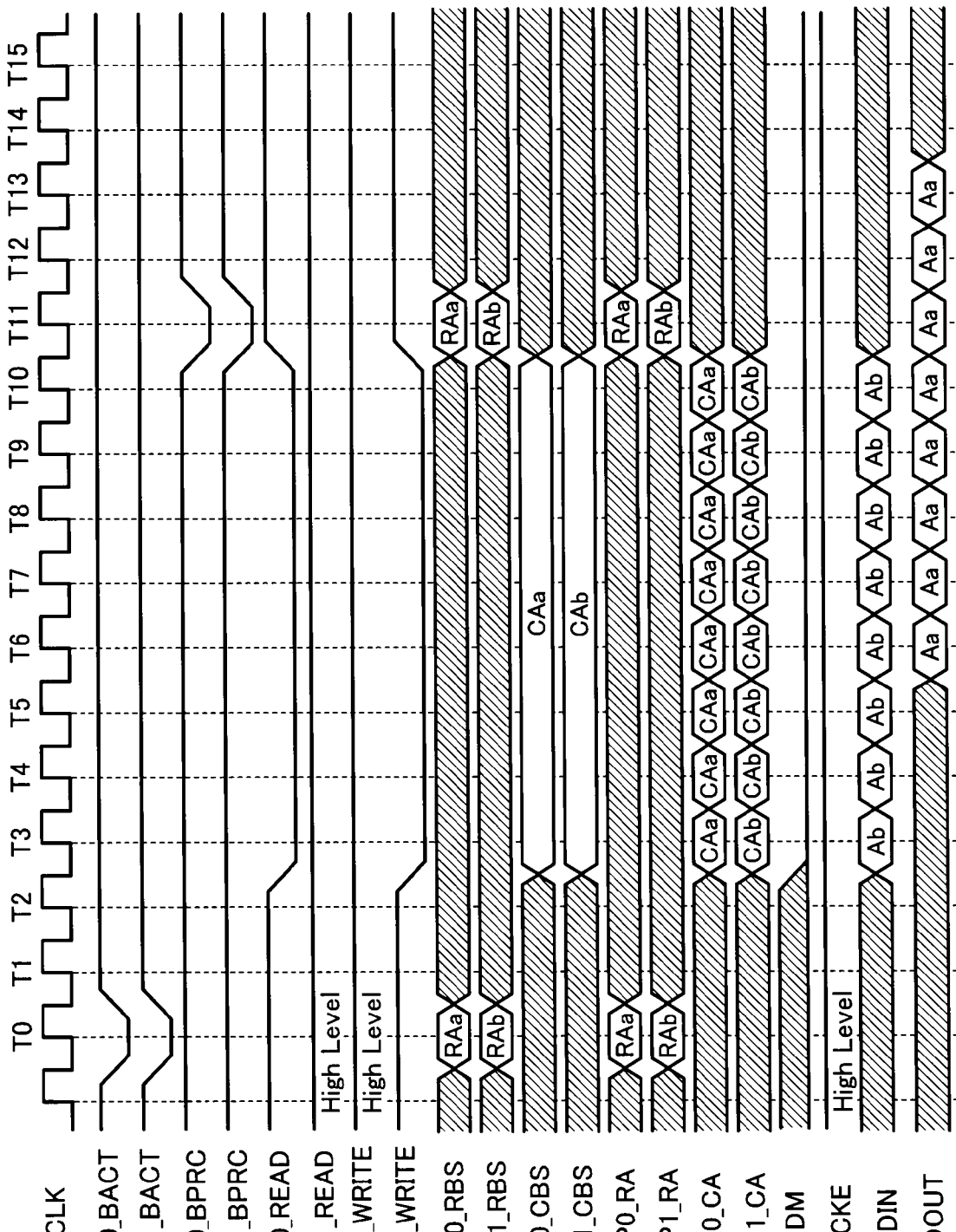
FIG. 7 is a timing chart at the time of concurrent read/write operations in the same semiconductor memory device.

FIG. 7 is a timing chart showing times T0-T15 on clock line CLK of concurrent read/write operations in the present embodiment when the read operation is executed from the port to the bank #1 and the write operation is executed from the port 1 to the bank #2 at the same time.

First, the row bank address P0_RBS and the row address P0_RA at the port 0 are specified with the row address RAa of the bank #1 and then the bank active signal /P0BACT is made "L" to activate the bank #1 (T0).

Next, the column bank address P0_CBS and the column address P0_CA are specified with the column address CAa of the bank #1 and then the read signal /P0_READ is made "L" to select the bank #1 (T2-T10), and DM is made "L", and, after a certain time elapsed, data Aa is read out of the bank #1 as the output data DOUT (T6-T13).

On the other hand, as for the port 1, similarly, the column bank address P1_RBS and the row address P0_RA are specified with the row address RAb of the bank #2 and the row address RAa and then the bank active signal /P1_BACT is made "L" to activate the bank #2 (T0).

Next, the column bank address P1_CBS and the column address P1_CA are specified with the column address CAb of the bank #2 and then the write signal /P1_WRITE is made "L" to select the bank #2 and write data Ab in the bank #2 as the input data DIN (T2-T10).

Next, a test on concurrent read/write operations shown in FIG. 7 in the present embodiment is described. A semiconductor memory device of which memory unit 1 is a 2-port 4-bank memory is herein described by way of example.

Figure 8:
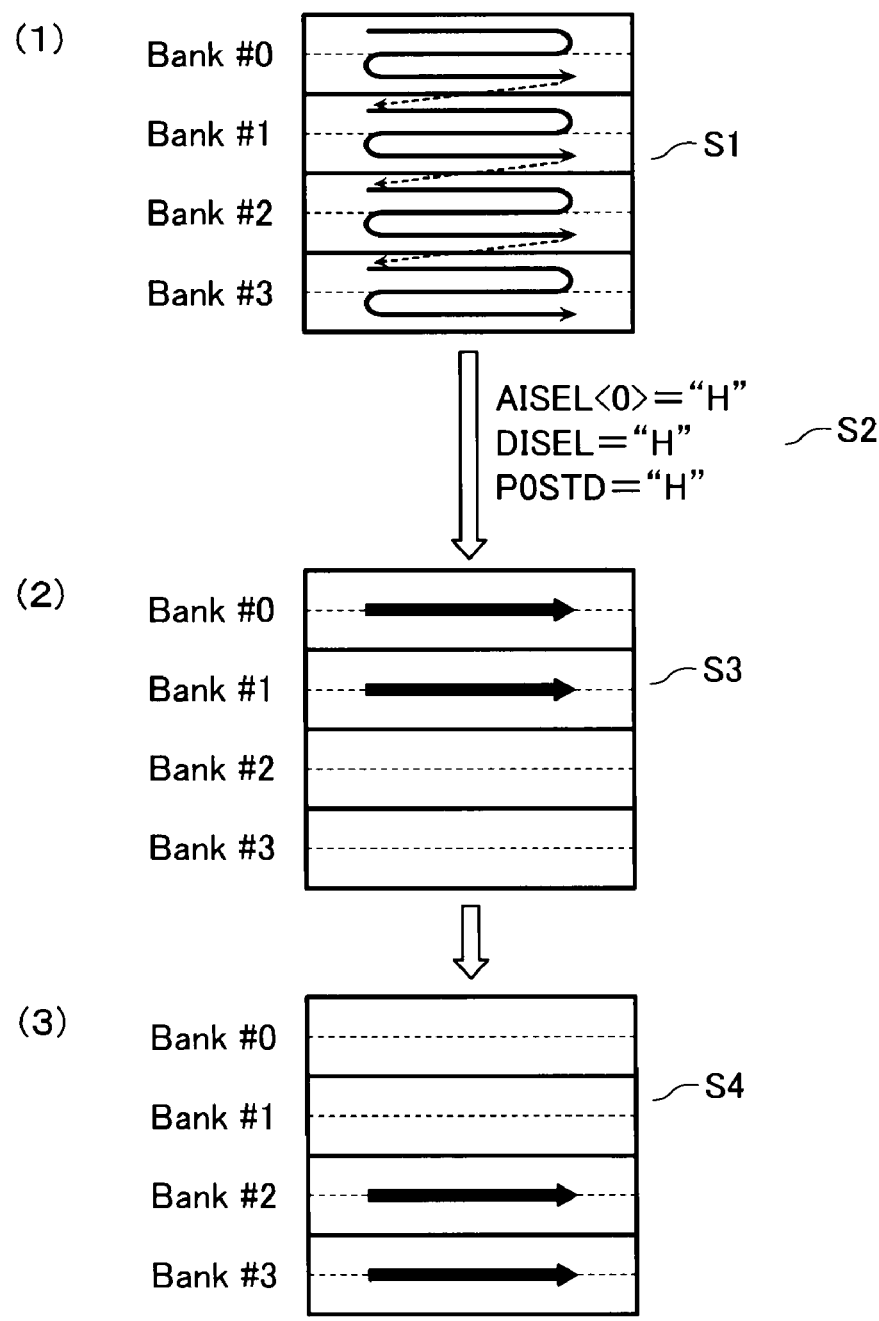
FIG. 8 shows an outline of a test on concurrent read/write operations in the same semiconductor memory device.

FIG. 8 is a conceptual view of the test on concurrent read/write operations in the present embodiment.

Previously, 0 is written from the port 0 or the port 1 in all memory cells in 4 banks prior to the operation test on concurrent read/write operations (S1) as shown in (1).

Next, the inversion bit selection signal AISEL<0>="H" is set to "H" and the input data inversion selection signal DISEL="H" is set to "H", and POSTD=H is set to "H" (S2).

Then, while 0 read is executed from the port 0 to a bank #0, data write is executed from the port 1 to a bank #1 (S3) as shown at (2).

Finally, while data read is executed from the port 1 to a bank #2, data write is executed from the port 0 to a bank #3 (S4) as shown at (3).

Figure 9:
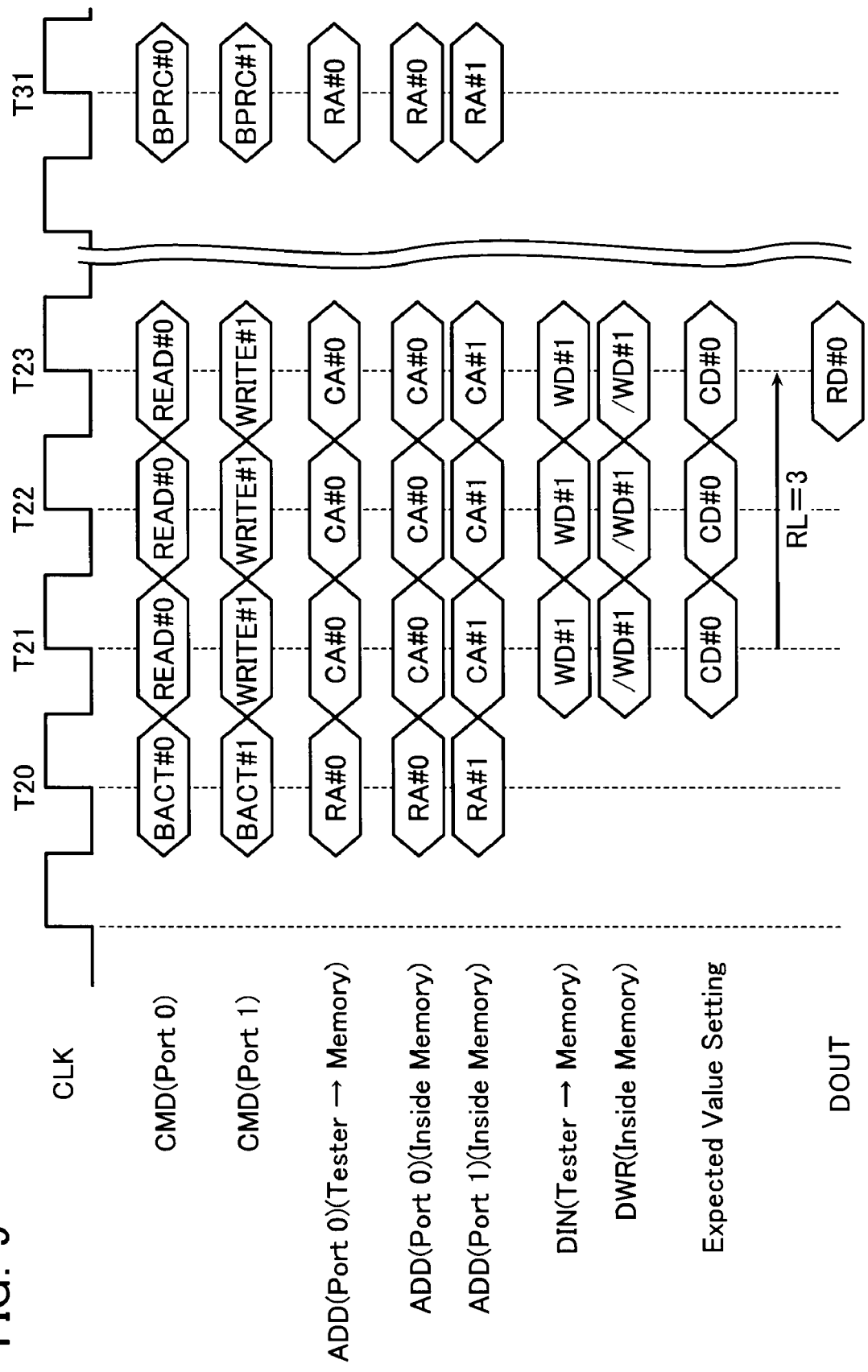
FIG. 9 is a timing chart at the time of an operation test on concurrent read/write operations in the same semiconductor memory device.

FIG. 9 is a timing chart showing times T20-T31 on clock line CLK at the time (S3) of an operation test on the read operation from the port 0 to the bank #0 and the write operation from the port 1 to the bank #1.

First, the memory tester ADD (Port 0) (Tester→Memory) designates the row bank address RA#0 of the bank #0 and gives a bank active instruction BACT#0 to the port 0 shown on line CMD (Port 0) and a bank active instruction BACT#1 to the port 1 shown on line CMD (Port 1). At this time, the row bank address conversion circuit 5 generates a second row bank address RA#1 based on the first row bank address RA#0 given from the memory tester. Thereafter, it provides the first row bank address RA#0 to the port 0 for standard-use and the second row bank address RA#1 to the other port 1. Thus, the bank #0 and the bank #1 are selected and activated (T20) at ADD (Port 0) (Inside Memory) and ADD (Port 1) (Inside Memory), respectively.

Subsequently, the memory tester designates the column bank address CA#0 of the bank #0, and gives a read instruction READ#0 to the port 0 and a write instruction WRITE#1 to the port 1. In addition, it sets write data WD#1 and an Expected Value Setting CD#0 having the same value as the write data WD#1 from DIN (Tester-Memory) (T21-). At this time, the column bank address conversion circuit 6 generates a second column bank address CA#1 based on the first column bank address CA#0 given from the memory tester. Thereafter, it provides the first column bank address CA#0 to the port 0 for read operation-use and the second column bank address CA#1 to the other port 1. The input data WD#1 is bit-inverted at the write data conversion circuit 14 and then transferred to the data buffer 2 (/WD#1). Thus, the write data /WD#1 is written in the bank #1 at DWR (Inside Memory). On the other hand, when a certain time elapsed after the issue of the read instruction READ#0 (a read latency RL=3 in FIG. 9), the output data RD#0 read out of the bank #0 is compared with the expected value CD#0 (T23-).

After completion of the concurrent read/write operations as above, bank precharge instructions BPRC#0 and BPRC#1 are given to the port 0 and the port 1 to bring the bank #0 and the bank #1 into the idle state (T31).

Figure 10:
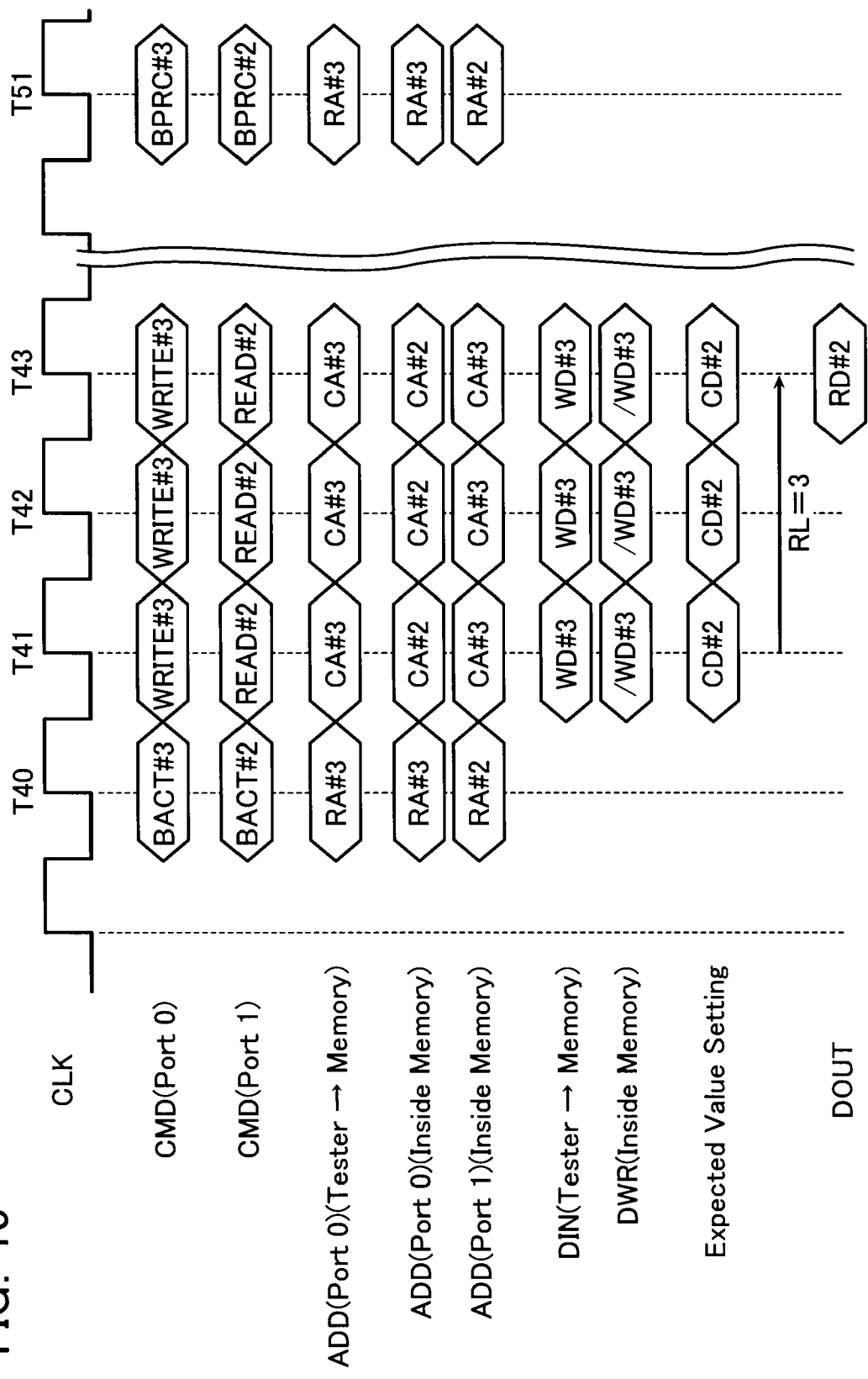
FIG. 10 is a timing chart of an operation test on concurrent read/write operations in the same semiconductor memory device.

FIG. 10 is a timing chart at times T40-T51 on clock line CLK at the time (S4) of an operation test on the write operation at the port 0 to the bank #3 and the read operation from the port 1 to the bank #2. The left hand indications correspond with those in FIG. 9.

First, the memory tester designates the row bank address RA#3 of the bank #3 and gives a bank active instruction BACT#3 to the port 0 and a bank active instruction BACT#2 to the port 1. At this time, the row bank address conversion circuit 5 generates a second row bank address RA#2 based on the first row bank address RA#3 given from the memory tester. Thereafter, it provides the first row bank address RA#3 to the port 0 for standard-use and the second row bank address RA#2 to the other port 1. Thus, the bank #2 and the bank #3 are selected and activated (T40).

Subsequently, the memory tester designates the column bank address CA#3 of the bank #3, and gives a write instruction WRITE#3 to the port 0 and a read instruction READ#2 to the port 1. In addition, it sets write data WD#3 and an expected value CD#2 having the same value as the write data WD#3 (T41–). At this time, the column bank address conversion circuit 6 generates a second column bank address #2 based on the first column bank address CA#3 given from the memory tester. Thereafter, it provides the first column bank address CA#3 to the port 1 for read operation-use and the second column bank address CA#2 to the other port 0. The write data WD#3 is bit-inverted at the write data conversion circuit 14 and then transferred to the data buffer 2 (/WD#3). Thus, the write data /WD#3 is written in the bank #3. On the other hand, when a certain time elapsed after the issue of the read instruction READ#2 (a read latency RL=3 in FIG. 10), the output data RD#2 read out of the bank #2 is compared with the expected value CD#2 (T43–).

After completion of the concurrent read/write operations as above, bank precharge instructions BPRC#3 and BPRC#2 are given to the port 0 and the port 1 to bring the bank #3 and the bank #2 into the idle state (T51).

A general memory tester is not possible to specify two ports with different addresses at the same time and generate different write data and expected-value data at the same time. Therefore, in the case of the semiconductor memory device according to the prior art, a sufficient functional test can not be made with the general memory tester as a problem.

With this regard, in accordance with the present embodiment, it is made possible to carry out a test on concurrent read/write operations to different banks even with the use of the general memory tester.

In accordance with the present embodiment, the row address and the column address fed to the port-1 control circuit 4 at the time of testing are always the row address P0_RA and the column address P0_CA fed from external, which are same as the row address and the column address given to the port-1 control circuit 3. Even in such the case, however, it is possible to carry out a test on concurrent read/write operations to different banks using 2 ports.

Specifying the ports 0 and 1 with different row and column addresses can be supported by such circuits that are similar to the row bank address conversion circuit 5 and the column bank address conversion circuit 6 and separately provided to the row address and the column address.

Second Embodiment

Figure 11:
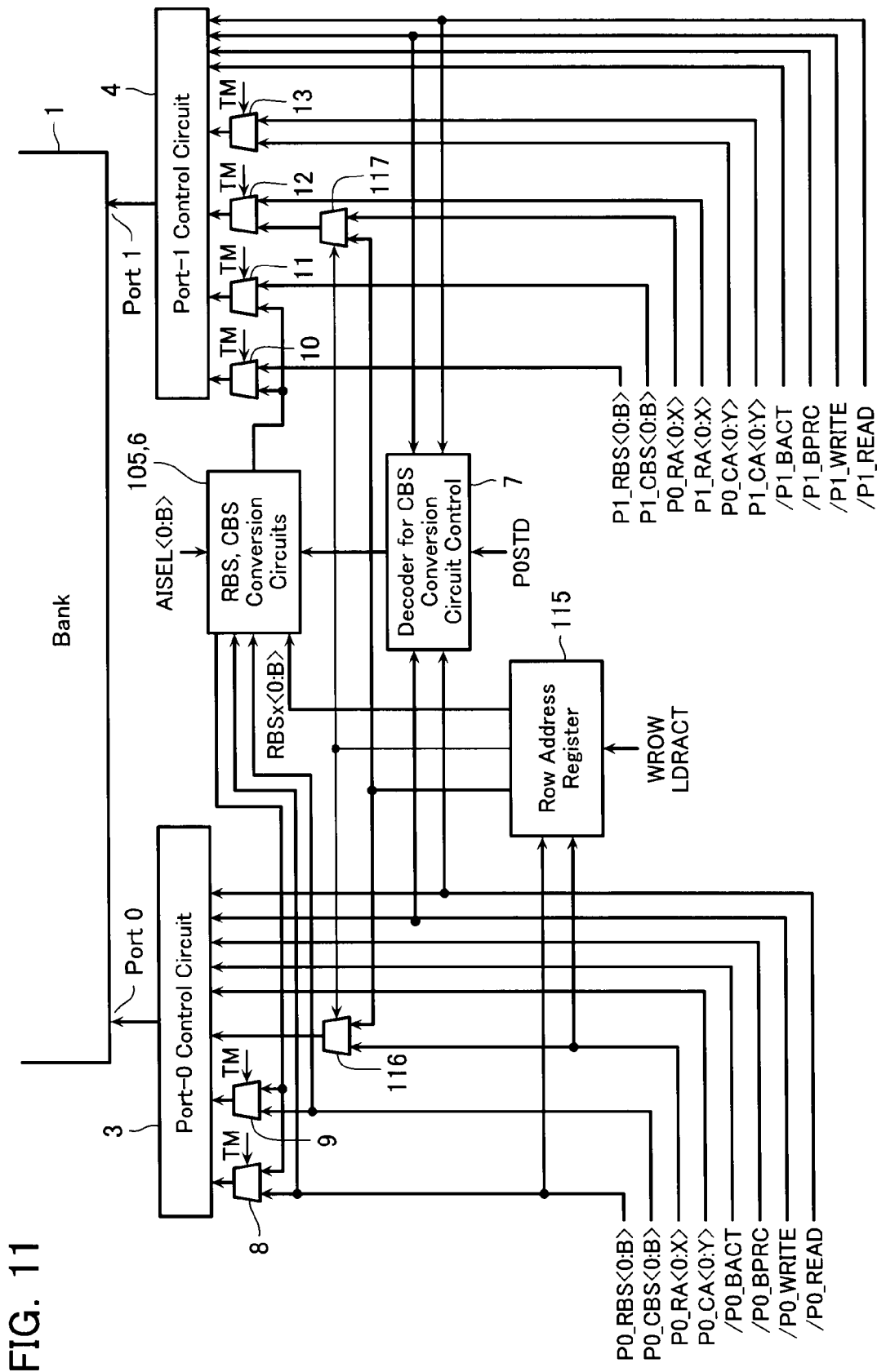
FIG. 11 is a block diagram of a semiconductor memory device according to a second embodiment of the present invention.

FIG. 11 is a block diagram of a semiconductor memory device according to a second embodiment of the present invention. The indications in FIG. 11 similar to those shown in FIG. 1 and not repeated here.

The present embodiment further comprises, in addition to the semiconductor memory device according to the first embodiment, a row address register 115 operative to hold the contents of the third row bank address P0_RBS<0:B> and the row address P0_RA<0:X>, and selection switches 116 and 117 operative to transfer the row address P0_RA<0:X> (hereinafter referred to as P0_RA1) held in the row address register 115 and the row addresses P0_RA<0:X> and P1_RA<0:X> alternatively to the port-0 control circuit 3 and the port-1 control circuit 4.

The row address register 115 receives the row bank address P0_RBS<0:B> and the row address P0_RA<0:X>. In addition, it receives a load act signal LDRACT that gives an instruction for holding the first row bank address P0_RBS<0:B> and the row address P0_RA<0:X>, currently given, and a control signal WROW that gives an instruction for transferring the third row bank address P0_RBS1 and the row address P0_RA1, currently held, to the row bank address conversion circuit 105 and the selection switches 116, 117. These input signals are processed in a control circuit contained in the row address register.

The selection switches 116 and 117 are controlled by the control circuit in the row address register 115. These switches select the row addresses P0_RA<0:X> and P1_RA<0:X> and transfer them to the port-0 control circuit 3 and the port-1 control circuit 4. When the row address register 115 receives the control signal WROW, the control circuit in the row address register 115 switches the selection switches 116 and 117 to supply the row address P0_RA1 to the port-0 control circuit 3 and the port-1 control circuit 4.

Operation of the present embodiment is described. The following description is given to the case where the third and fourth banks are further activated while two banks are subjected to concurrent read/write operations.

Figure 12:
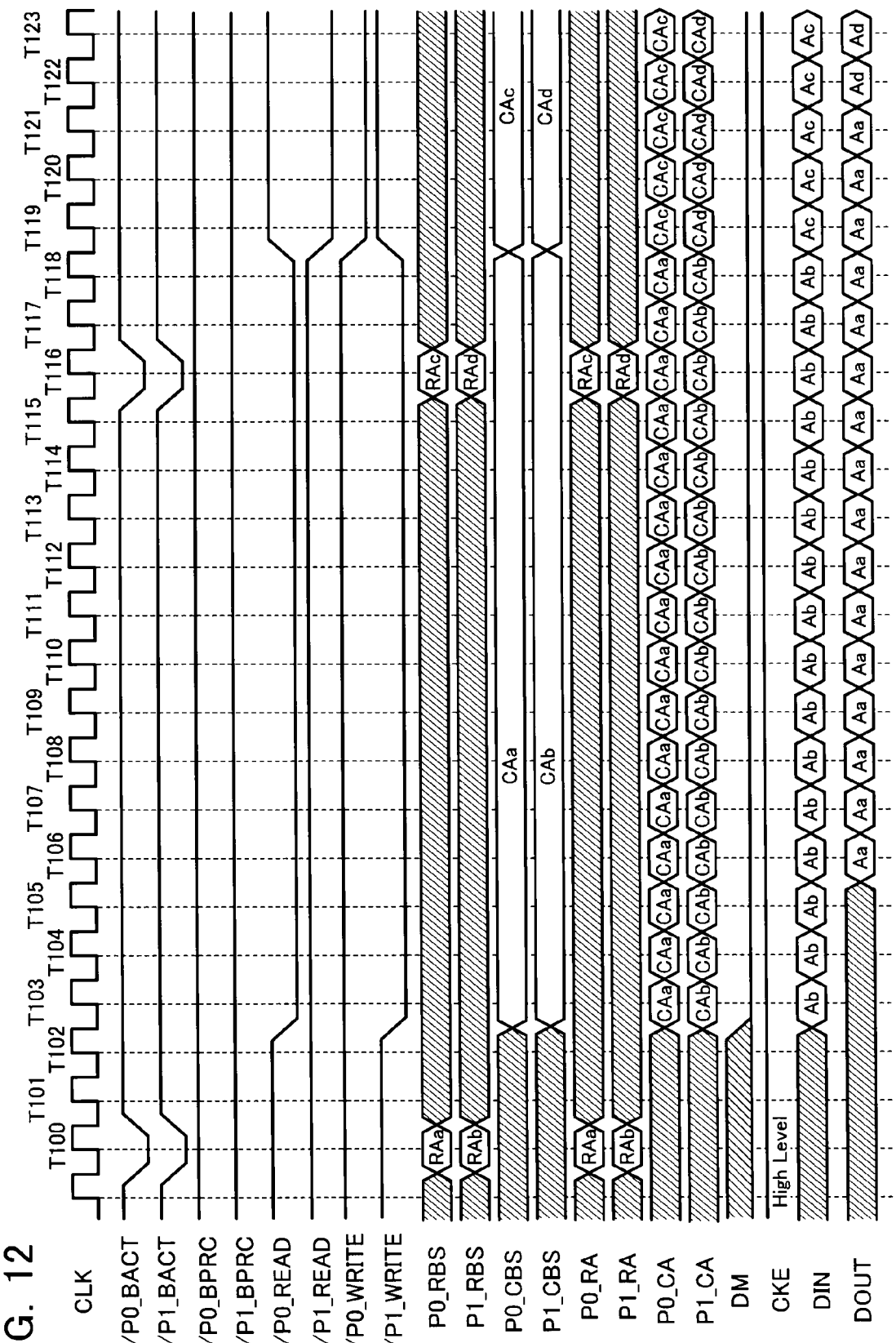
FIG. 12 is a timing chart of concurrent read/write/bank active operations in the same semiconductor memory device.

FIG. 12 is a timing chart from times T100-T123 on clock line CLK of concurrent read/write/bank active operations in the present embodiment. Indications similar to those in FIG. 7 are not repeated here.

First, at the port 0, the bank active signal /P0_BACT is turned "L" and the row address RAa is given, thereby activating the first bank, that is, the bank a (T100). Next, the read signal /P0_READ is turned "L" and the column address CAa is fed (T102-T108). When a certain period of time elapsed (a read latency=3CLK in FIG. 12), data Aa is provided as the output data DOUT from the first bank #0 (T106-T121).

On the other hand, at the port 1, the bank active signal /P1_BACT is turned "L" and the row address RAb is given, thereby activating the second bank, that is, the bank #1 (T100). Next, the write signal /P1_WRITE is turned "L" and the column address CAb is given, thereby writing the input data DIN, that is, data Ab in the bank #1 (1102-T118).

After completion of the concurrent read/write operations to the bank #0 and the bank #1, a write operation to a third bank, that is, a bank #2 and a read operation to a fourth bank, that is, a bank #3 are started continuously (T119, T122). For that purpose, the bank #2 and the bank #3 are activated during the read operation to the bank #0 and the write operation to the bank #1 (T116).

In the series of the above operations, the most problematic matter is the bank active operation to the bank #2 and the bank #3 at the time of the read operation to the bank a and the write operation to the bank #1 executed concurrently (T116), which corresponds to the worst case in a 2-port multi-bank memory when the supply voltage lowers.

Figure 13:
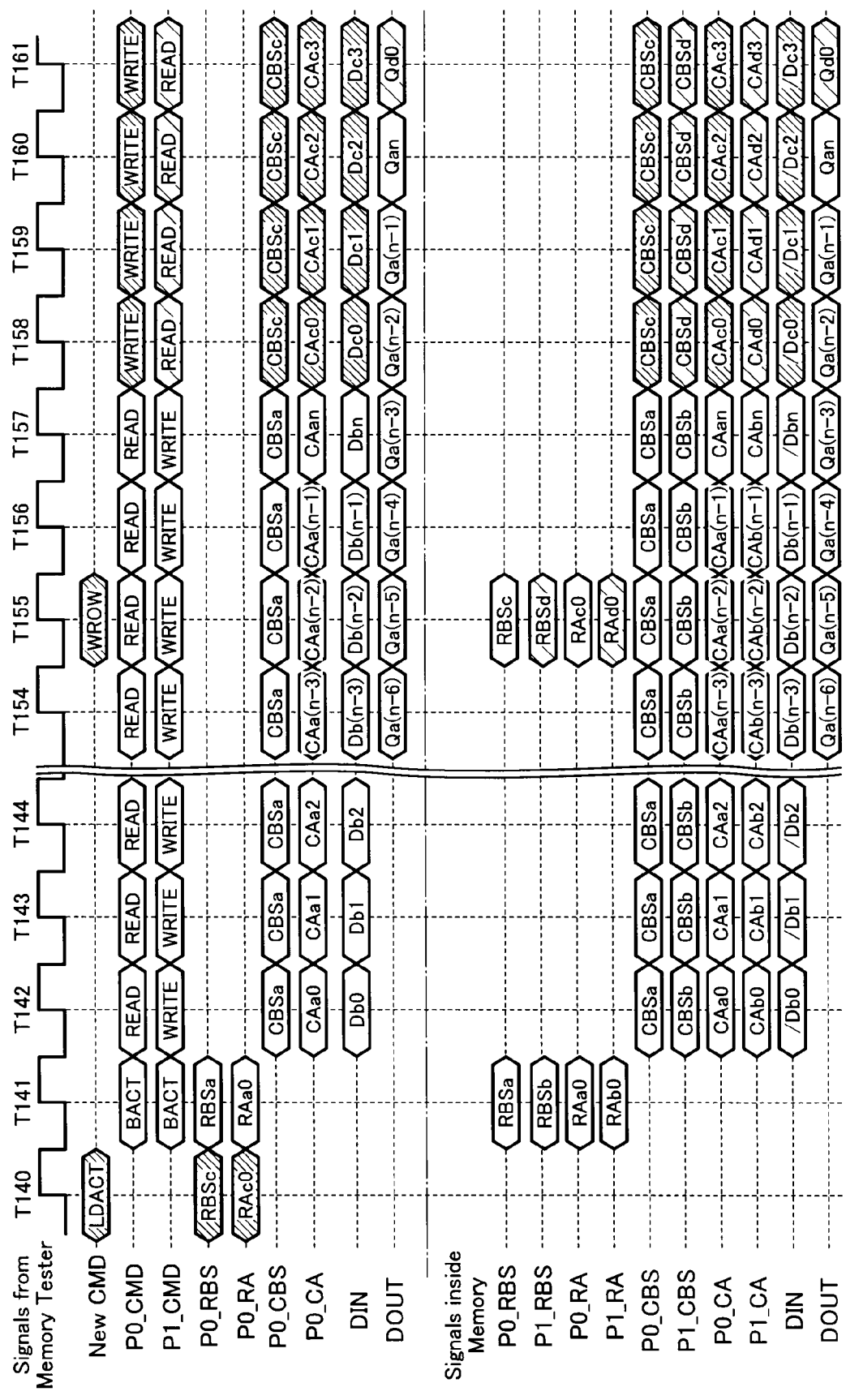
FIG. 13 is a timing chart at the time of an operation test on concurrent read/write/bank active operations in the same semiconductor memory device.

FIG. 13 is a timing chart from times T140-1161 of the signals from the memory tester and the signals inside the memory in the present embodiment at the time of a test made on the concurrent read/write/bank active operations shown in FIG. 12. Similar indication from FIGS. 7 and 12 are not repeated here.

First, prior to the concurrent read/write operations to the first and second banks, that is, the bank #0 and the bank #1, the memory tester previously designates the row bank address RBSc of the third bank, that is, the bank #2 and the row address RAc0, and gives a load act instruction LDACT (T104), thereby holding the row bank address RBSc of the bank #2 and the row address RAc0 in the row address register 115.

Next, the memory tester designates the row bank address RBSa and the row address RAa0, and gives a bank active instruction BACT to the port 0 and the port 1. At this time, the row bank address RBSb of the second row bank, that is, the bank #1 is generated based on the row bank address RBSa fed to the row bank address conversion circuit 105 inside the memory, thereby making the bank #0 and the bank #1 active (T141).

Next, a read instruction READ and a write instruction WRITE are given to the port 0 and the port 1 (T142), thereby starting a write operation to the bank #1 (T142-1157). When a certain period of time elapsed, a read operation to the bank #0 is started (T145, not shown in FIG. 13, through T160). In this example, pieces of input data /Db0-/Dbn to the bank #1 are derived from the input data Db0-Dbn given from the memory tester and bit-inverted at the write data conversion circuit 14 inside the memory.

During the concurrent read/write operations to the bank #0 and the bank #1, the memory tester issues the control instruction WROW. In this case, the third row bank address P0_RBSc and the row address P0_RAc0 held in the row address register 115, as well as a bank address RBSd of a fourth bank, that is, a bank #3, generated based on the given bank address RBSc, and a row address RAd0 identical to the row address RAc0 are given to the port 0 and the port 1 to make the bank #2 and the bank #3 active (T155). Thus, immediately after completion of the read operation to the bank #0 and the write operation to the bank #1 (T160, T157), a write operation to the bank #2 and a read operation to the bank #3 can be started (T158, T160).

In accordance with the second embodiment, it is possible to provide a semiconductor memory device such as a 2-port multi-bank memory sufficiently capable of an operation test with the use of a general memory tester even in the worst case when the supply voltage lowers.

Third Embodiment

A semiconductor memory device according to a third embodiment includes plural such row address registers 115, one of which is contained in the semiconductor memory device according to the second embodiment.

This configuration makes it possible to support an operation test on concurrent read/write/bank active operations, which include the concurrent read/write operations to the first and second banks, that is, the bank #0 and the bank #1 (T203-T218), and additionally activating the third and fourth banks, that is, the bank #2 and the bank #3 (T216), and further activating a fifth and a sixth bank, that is, a bank #4 and a bank #5 (T217) as shown in FIG. 14.

In the case of carrying out a test on the operation as shown in FIG. 14 from times T200-T223, the semiconductor memory device according to the second embodiment may be given one additional row address register 115' and thus provided with two row address registers in total. Similar indications from previous figures are not repeated here.

First, previously, the row address register 115 holds the row address RAc of the third bank, that is, the bank #2 and the newly added row address register 115' holds the row address RAe of the fifth bank, that is, the bank #4.

Next, the bank #0 and the bank #1 are activated (T200) and the concurrent read/write operations to the bank #0 and the bank #1 are executed (T203-T218). During the concurrent read/write operations, when the control signal WROW is given to the row address register 115, the row address RAc of the bank #2 held in the row address register 115 is transferred to the row bank address conversion circuit 105. On reception of this, the row bank address conversion circuit 105 generates the row bank address RAd of the fourth bank, that is, the bank #3, and transfers it to the port-0 control circuit 3 and the port-1 control circuit 4. At this time, the bank active signals /P0_BACT and /P1_BACT are activated at "L", thereby activating the bank #2 and the bank #3 (T216). Subsequently, when the control signal WROW is given to the row address register 115', the row address RAe of the bank #4 held in the row address register 115' is transferred to the row bank address conversion circuit 105. On reception of this, the row bank address conversion circuit 105 generates the row bank address RAf of the sixth bank, that is, the bank #5, and transfers it to the port-0 control circuit 3 and the port-1 control circuit 4. At this time, the bank active signals /P0_BACT and /P1_BACT are activated at "L", thereby activating the bank #4 and the bank #5 (T217).

In accordance with the present embodiment, it is possible to hold one different row bank address in one row address register and accordingly activate much more banks than the second embodiment even during concurrent read/write operations.

The row address register 115 in the semiconductor memory device according to the second embodiment may include an update means operative to count up the held row bank address every time of the input of the control signal WROW to exert the similar effect.

What is claimed is:

1. A semiconductor memory device, comprising:
   a memory unit having a first and a second port and including plural banks;
   a bank address conversion circuit operative to convert a first bank address fed from external into a second bank address different from said first bank address and operative to supply said first bank address to one of said first and second ports and supply said second bank address to the other of said first and second ports; and
   a write data conversion circuit operative to convert input data fed from external into write data different from said input data and operative to supply said input data to one of said first and second ports and supply said converted write data to the other of said first and second ports.

2. The semiconductor memory device according to claim 1, wherein said first bank address contains a first row bank address and a first column bank address, and said second bank address contains a second row bank address and a second column bank address,
   said bank address conversion circuit includes a row bank address conversion circuit operative to convert said first row bank address into said second row bank address, and a column bank address conversion circuit operative to convert said first column bank address into said second column bank address.

3. The semiconductor memory device according to claim 2, further comprising a decoder operative to control said column bank address conversion circuit so as to supply said first column bank address to the port given said input data.

4. The semiconductor memory device according to claim 2, further comprising a row bank address register operative to store a third row bank address,
wherein said row bank address register includes a control circuit operative to control said bank address conversion circuit so as to convert said third row bank address into a fourth row bank address while a first bank and a second bank in said memory unit designated with said first and second bank addresses are subjected to read and write and operative to activate a third bank and a fourth bank in said memory unit based on said third and fourth row bank addresses.

5. The semiconductor memory device according to claim 4, further comprising a means operative to update said third and fourth row bank addresses.

6. The semiconductor memory device according to claim 2, wherein said row bank address conversion circuit includes
a row bank address conversion unit operative to convert said first row bank address into said second row bank address based on an inversion bit selection signal indicative of inversion/non-inversion on a bit basis, and
a selection gate unit operative to provide said first row bank address to one port for standard-use of said first and second ports, and provide to the other port said second row bank address given from said row bank address conversion unit.

7. The semiconductor memory device according to claim 2, wherein said column bank address conversion circuit includes
a column bank address conversion unit operative to convert said first column bank address into said second column bank address based on an inversion bit selection signal indicative of inversion/non-inversion on a bit basis, and
a selection gate unit operative to provide said first column bank address to one port for read operation-use of said first and second ports, and provide to the other port said second column bank address given from said column bank address conversion unit.

8. The semiconductor memory device according to claim 1, wherein said write data conversion circuit converts said input data into said write data through bit inversion.

9. A semiconductor memory device, comprising:
a memory unit having a first and a second port and including plural banks; and
a bank address conversion circuit operative to convert a first bank address fed from external into a second bank address different from said first bank address and operative to supply said first bank address to one of said first and second ports and supply said second bank address to the other of said first and second ports.

10. The semiconductor memory device according to claim 9, further comprising a write data conversion circuit operative to convert input data fed from external into write data different from said input data and operative to supply said input data to one of said first and second ports and supply said converted write data to the other of said first and second ports.

11. The semiconductor memory device according to claim 10, wherein said write data conversion circuit converts said input data into said write data through bit inversion.

12. The semiconductor memory device according to claim 9, wherein said first bank address contains a first row bank address and a first column bank address, and said second bank address contains a second row bank address and a second column bank address,
said bank address conversion circuit includes a row bank address conversion circuit operative to convert said first row bank address into said second row bank address, and a column bank address conversion circuit operative to convert said first column bank address into said second column bank address.

13. The semiconductor memory device according to claim 12, further comprising a decoder operative to control said column bank address conversion circuit so as to supply said first column bank address to the port given said input data.

14. The semiconductor memory device according to claim 12, further comprising a row bank address register operative to store a third row bank address,
wherein said row bank address register includes a control circuit operative to control said bank address conversion circuit so as to convert said third row bank address into a fourth row bank address while a first bank and a second bank in said memory unit designated with said first and second bank addresses are subjected to read and write and operative to activate a third bank and a fourth bank in said memory unit based on said third and fourth row bank addresses.

15. The semiconductor memory device according to claim 14, further comprising a means operative to update said third and fourth row bank addresses.

16. A semiconductor memory device, comprising:
a memory unit having a first and a second port and including plural banks;
a bank address register operative to store a bank address fed from external;
a bank address conversion circuit operative to convert said bank address fed from external or said bank address stored in said bank address register into a bank address different from these bank addresses and operative to supply said bank address before conversion to one of said first and second ports and supply said bank address after conversion to the other of said first and second ports; and
a write data conversion circuit operative to convert input data fed from external into write data different from said input data and operative to supply said input data to one of said first and second ports and supply said converted write data to the other of said first and second ports.

17. The semiconductor memory device according to claim 16, wherein said bank address register is one of such plural bank address registers contained in said semiconductor memory device.

18. The semiconductor memory device according to claim 16, wherein said bank address register includes a means operative to update said bank address stored therein.

19. The semiconductor memory device according to claim 16, wherein said bank address contains a row bank address and a column bank address,
wherein said bank address conversion circuit includes a row bank address conversion circuit operative to convert said row bank address, and a column bank address conversion circuit operative to convert said column bank address.

20. The semiconductor memory device according to claim 19, further comprising a decoder operative to control said column bank address conversion circuit so as to supply said column bank address before conversion to the port given said input data.

* * * * *